(12) United States Patent
Coppock et al.

(10) Patent No.: US 6,440,781 B1
(45) Date of Patent: Aug. 27, 2002

(54) METHOD OF ADDING BIAS-INDEPENDENT ALUMINUM BRIDGED ANTI-FUSES TO A TUNGSTEN PLUG PROCESS

(75) Inventors: William M. Coppock; Charles Dark, both of Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/875,566

(22) Filed: Jun. 6, 2001

(51) Int. Cl.[7] .......................... H01L 21/82; H01L 29/00
(52) U.S. Cl. ....................................... 438/131; 257/530
(58) Field of Search ................................. 438/131, 128; 257/528, 530

(56) References Cited

U.S. PATENT DOCUMENTS 4,569,120 A * 2/1986 Stacy et al. .......... 148/DIG. 55
5,648,678 A * 7/1997 Begley et al. ............... 257/486
5,679,974 A * 10/1997 Shinriki et al. ................ 257/50
5,780,919 A * 7/1998 Chua et al. ................... 257/209
6,016,001 A * 1/2000 Sanchez et al. .............. 257/208
6,251,710 B1 * 6/2001 Radens et al. ............... 438/131

OTHER PUBLICATIONS

Donald T. Comer, "Zener Zap Anti–Fuse Trim in VLSI Circuits", VLSI Design, 1996, vol. 5, No. 1, pp. 89–100.

* cited by examiner

Primary Examiner—Michael Sherry
Assistant Examiner—Evan Pert
(74) Attorney, Agent, or Firm—Stallman & Pollock LLP

(57) ABSTRACT

A three-terminal integrated circuit device structure is provided that relies upon the formation of an anti-fuse through a silicon substrate with the melting and flowing of an aluminum/aluminum alloy to create the current path. The use of an oversized contact permits the Tungsten plug to be eliminated from the anti-fuse structure, but allows the aluminum melt and flow mechanism to be used with a Tungsten plug process.

10 Claims, 4 Drawing Sheets

METHOD OF ADDING BIAS-INDEPENDENT ALUMINUM BRIDGED ANTI-FUSES TO A TUNGSTEN PLUG PROCESS

BACKGROUND OF THE INVENTION

1. Field of the Invention

The present invention relates to semiconductor integrated circuits and, in particular, to a no-cost technique for adding bias independent aluminum bridged anti-fuse trim to a Tungsten plug process for fabricating integrated circuit structures.

2. Discussion of the Related Art

Zener zap diode anti-fuses, which depend upon bias direction to create the anti-fuse mechanism, are typically applied to integrated circuit fabrication processes that utilize interconnects of aluminum, aluminum alloy only, or an aluminum alloy with a barrier metal. An overview of Zener zap diode anti-fuse trim is presented by D. T. Comer, "Zener Zap Anti-Fuse Trim in VLSI Circuits", VLSI Design, 1996, Vol. 5, No. 1, pp. 89–100.

However, when Tungsten interconnect processes are used, the aluminum melt and flow mechanisms that Zener zap diodes rely upon are blocked. The blocking feature is the Tungsten plug itself.

Thus, there is a need for a bias-independent anti-fuse mechanism utilizable in a Tungsten plug process.

SUMMARY OF THE INVENTION

The present invention provides a three terminal integrated circuit device structure that relies upon the formation of an anti-fuse through the silicon substrate. This is accomplished by the melting and flowing of an aluminum alloy through the silicon to create a permanent conduction path. The use of an oversized contact permits the Tungsten plug to be eliminated from the anti-fuse structure, restoring the aluminum/aluminum alloy conduction path and allowing the aluminum/aluminum alloy melt and flow mechanism to be used with a Tungsten plug process. The design allows for a high resistance off state before trim and a low resistance state after trim. The technique is not dependant upon polarity, as is the case with Zener zap diodes.

The elimination of the Tungsten from the plug in the anti-fuse structure could be accomplished with a separate mask and etch step, but that would require extra processing and added cost. The present invention requires no additional processing.

As used in this document, the term "oversized contact" is defined as a contact where the width of the contact is greater than two times the Tungsten deposition thickness. Clearly for proper Tungsten plugs to be formed, this dimension must be less than two times the Tungsten thickness for the plug to fill properly without a center void. When the contact width is greater than two times the Tungsten thickness, the Tungsten etchback will penetrate the seam area and, if the width is large enough, the Tungsten will be removed from the contact bottom in the same manner that it is removed from the open area on the wafer.

The features and advantages of the present invention will be more fully appreciated upon consideration of the following detailed description of the invention and the accompanying drawings, which sets forth an illustrative embodiment in which the principles of the invention are utilized.

DETAILED DESCRIPTION OF THE INVENTION

Figure 1A:
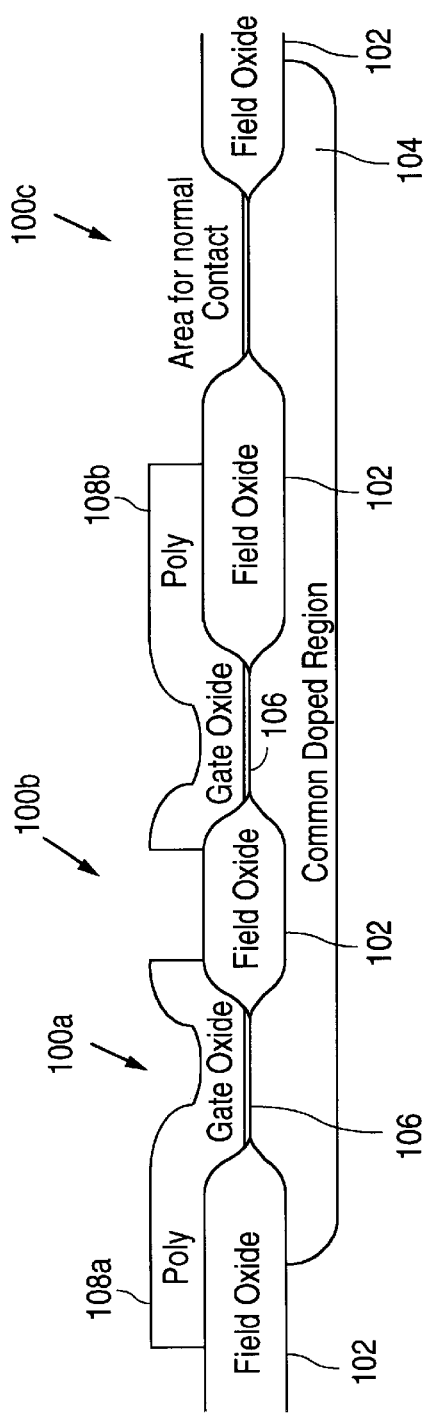
FIGS. 1A through 1F provide a sequence of partial cross-section drawings illustrating a method of adding bias-independent aluminum bridged anti-fuses to a Tungsten plug process in accordance with the concepts of the present invention.

The disclosed embodiment of the present invention, illustrated in FIGS. 1A–1F, is directed to fabrication of a three-terminal integrated circuit structure. As shown in FIG. 1A, the three terminal regions 100a, 100b and 100c are separated by field oxide 102, but formed over a common doped region 104 which may be either N-type or P-type conductivity. The three terminal regions 100a, 100b, 100c are opened during conventional integrated circuit processing.

Gate oxide 106 is grown over two terminal regions, i.e. regions 100a and 100b in FIG. 1A, in the conventional manner. The third contact region 100c can be silicided or salicided as part of the normal contact process and will receive a standard Tungsten plug contact, as discussed in greater detail below.

As further shown in FIG. 1A, a standard polysilicon layer is grown over the two terminal contact regions 100a and 100b and patterned using conventional photolithographic techniques to provide polysilicon regions 108a and 108b. Each of the polysilicon regions 108a, 108b extends up onto the adjacent field oxide 102 to reduce subsequent metallization step coverage requirements, although this may not be required in all applications. Further, the polysilicon regions 108a, 108b can be silicided, but this is also not required.

Figure 1B:
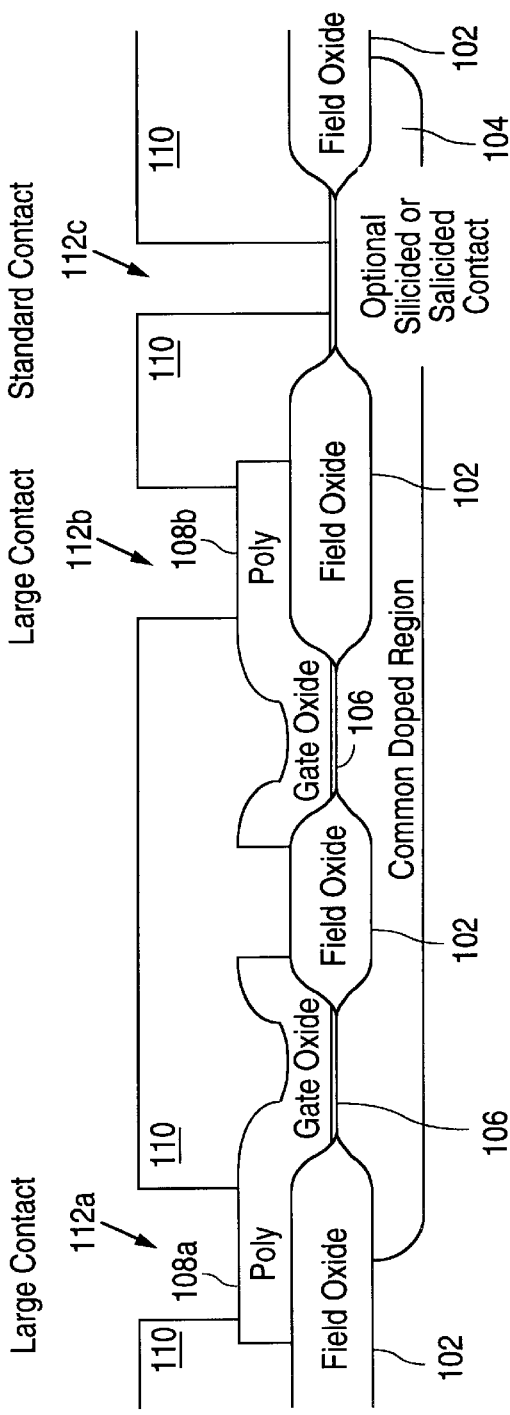

Referring to FIG. 1B, a first dielectric layer 110, typically silicon dioxide, is then formed according to conventional techniques. Oversized contact openings 112a and 112b are then cut to the two poly regions 108a and 108b, respectively. As mentioned above, these contact openings 112a, 112b are made to the polysilicon regions 108a, 108b over the field oxide 102 to reduce aluminum alloy metallization step coverage issues, but those skilled in the art will appreciate that contact directly over the gate may be allowed if the aluminum alloy metal thickness is sufficient.

As further shown in FIG. 1B, a standard-sized Tungsten plug contact opening 112c is made to the third terminal contact region 100c. This contact opening 112c can be silicided, or salicided, or neither, depending on the particular process requirements.

Figure 1C:
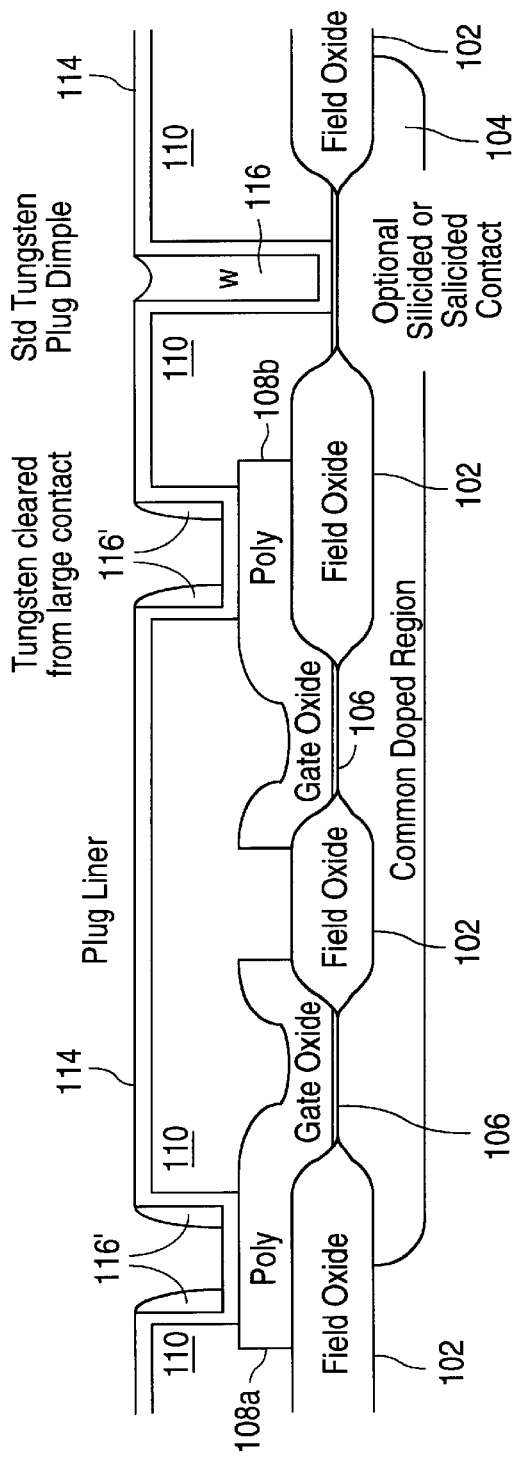

Referring to FIG. 1C, a layer of titanium nitride (TiN) plug liner material 114 (or other suitable plug liner material) and a layer of Tungsten (W) are then deposited in accordance with conventional techniques. An anisotropic Tungsten etch back process etches the standard sized Tungsten plug 116 in the contact region in the typical manner, stopping with a small dimple remaining on the top of the plug 116. During the etchback, all Tungsten is cleared from the oversized contact openings 112a and 112b in the same way that the Tungsten is cleared from the open areas. However, as illustrated in FIG. 1C, small residual Tungsten spacers 116' may remain at the edges of the large contact openings 112a and 112b; these spacers 116' are of no consequence. The Tungsten etchback will also leave the polysilicon undamaged, since the process is a Stop On TiN (SOT) technique, i.e. the Tungsten etchback stops on the TiN liner layer 114 (or other suitable plug liner material).

Figure 1D:
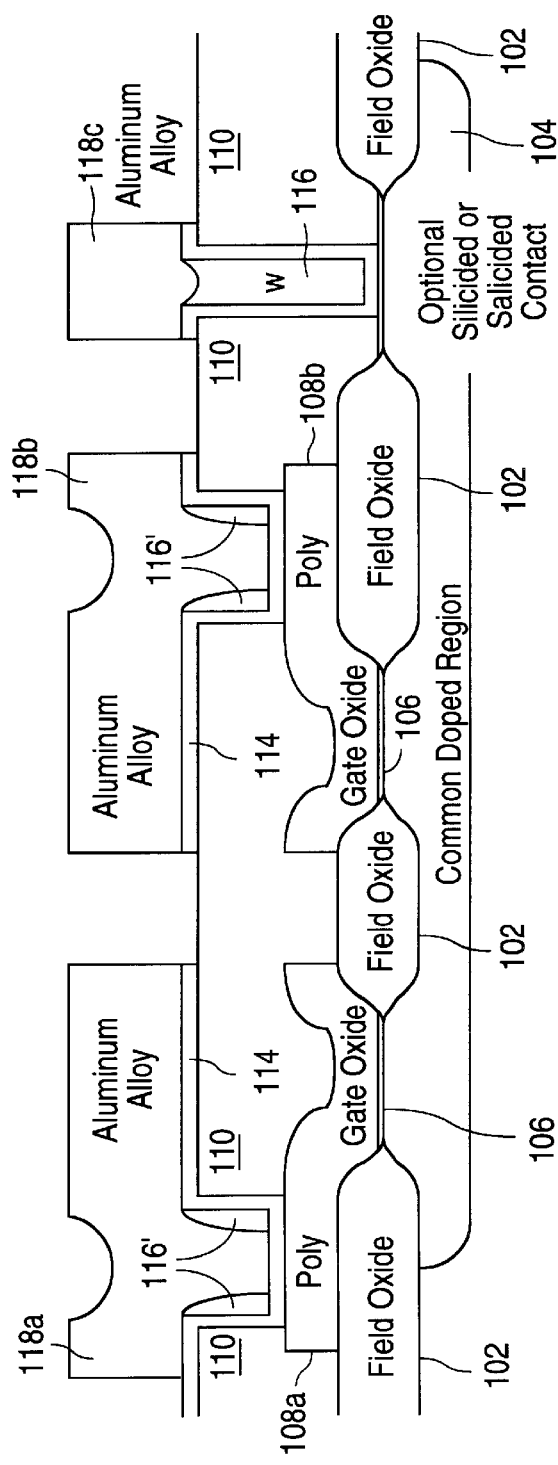

FIG. 1D shows a standard aluminum slab Metal 1 process in which a first aluminum layer is deposited according to conventional techniques and then masked and etched to provide aluminum contact regions 118a and 118b to polysilicon regions 108a and 108b, respectively, and aluminum contact region 118c to Tungsten plug 116.

Figure 1E:
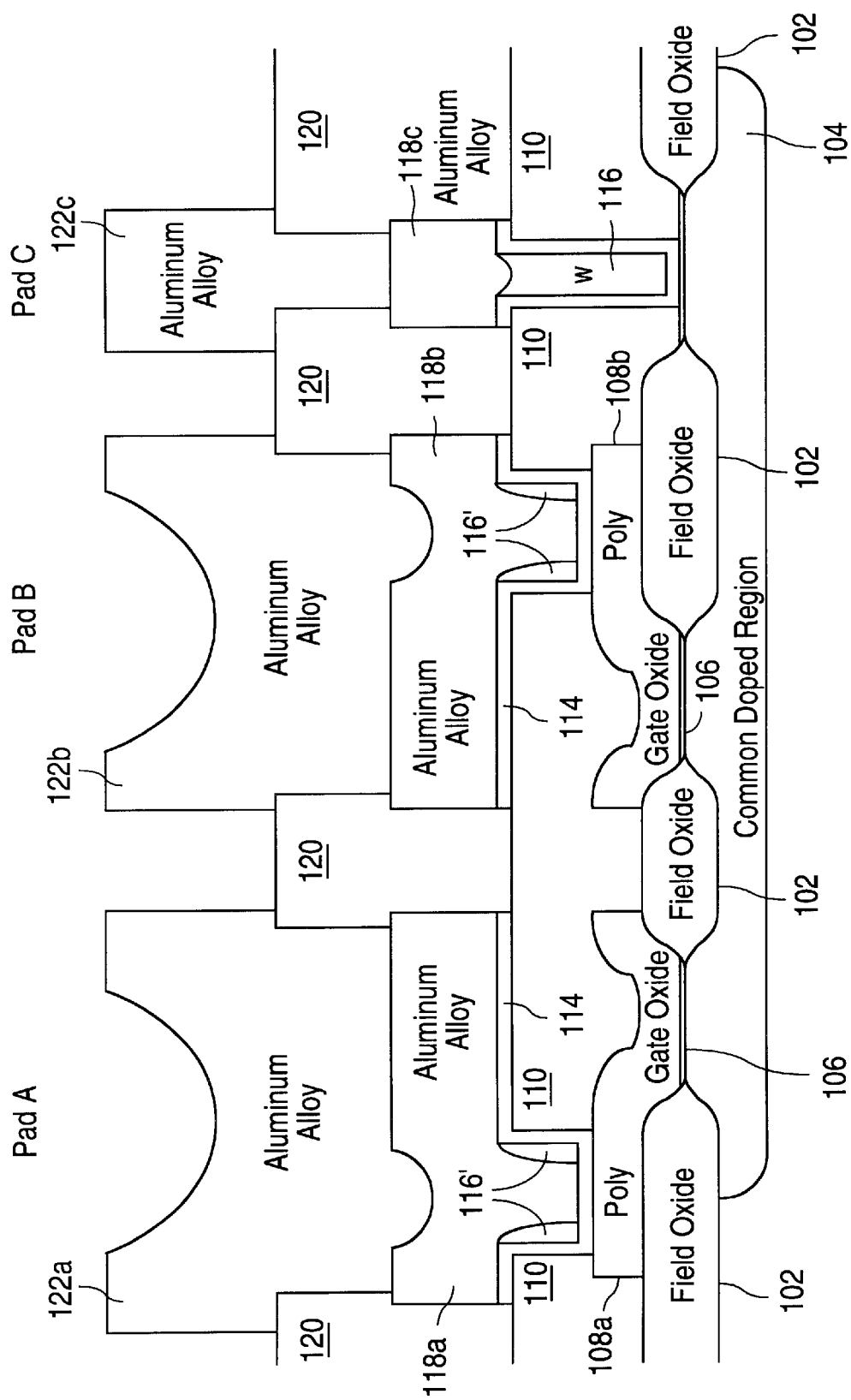

Referring to FIG. 1E, a second layer of dielectric material 120, typically silicon dioxide, is then deposited and patterned to provide vias for a Metal 2 deposition and etch. If an aluminum alloy only process is used for Metal 2, the vias can be standard sized, or they can also be oversized vias similar to the oversized contact process described above. If the Metal 2 module uses a Tungsten plug, then the Metal 2 process can be set up as a standard Tungsten plug. In any event, the procedure results in the formation of aluminum alloy Metal 2 contacts 122a, 122b and 122c to aluminum alloy Metal 1 contact regions 118a, 118b and 118c, respectively.

Final processing then proceeds in accordance with conventional processing techniques well known to those skilled in the art.

Figure 1F:
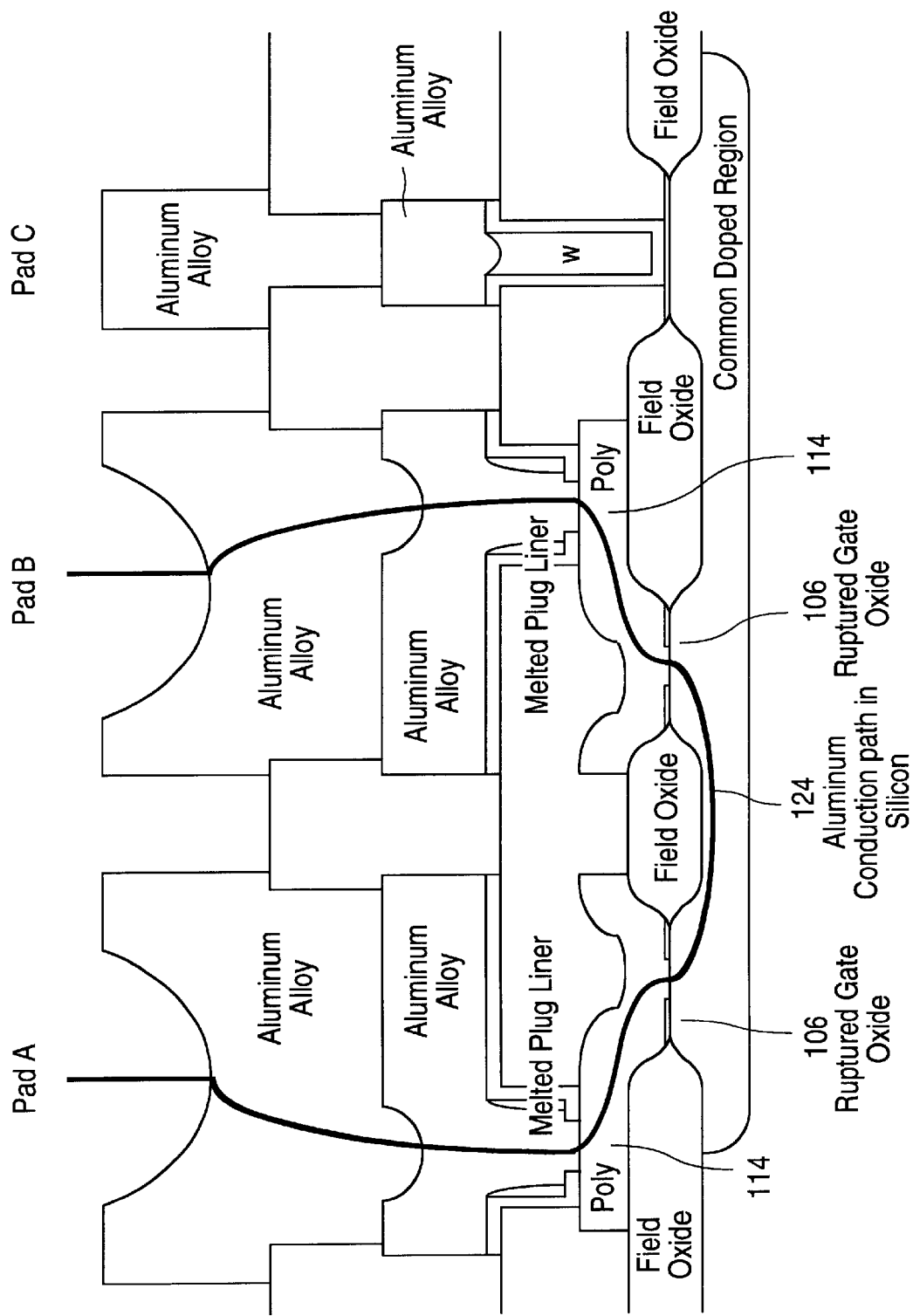

Referring to FIG. 1F, after final processing is completed, a trim procedure in accordance with the present invention can be accomplished as follows. First, sufficient voltage is supplied to Pad A and Pad C until the gate oxide 106 in contact region 100a is ruptured. Then, sufficient voltage is supplied to Pad B and Pad C until the gate oxide 106 in contact region 100b is ruptured. Sufficient current flow is then provided between Pad A and Pad B to melt the TiN plug liner material 114 (or other suitable plug liner material) in both contact region 100a and in contact region 100b and flow the aluminum alloy between the two terminals. This forms a permanent anti-fuse path in the silicon and completes a conductive path between terminals A and B, shown by the dark line 124 in FIG. 1F.

Given the above detailed description of the invention and the embodiments of the invention described therein, it is intended that the following claims define the scope of the invention in that structures and methods within the scope of these claims and their equivalents be covered thereby.

What is claimed is:

1. A method of forming a bias-independent aluminum bridge anti-fuse in a Tungsten plug process, the method comprising:

forming an integrated circuit device structure that includes a doped region formed in a silicon substrate, first, second and third spaced-apart contact regions formed on a surface of the doped region, the first and second contact regions, having a layer of gate dielectric material formed thereon, first and second polysilicon regions formed over the gate dielectric material on the first and second contact regions, respectively, a layer of insulating dielectric material formed over the first and second polysilicon regions and over the third contact region, the layer of insulating dielectric material having first and second oversized contact openings formed therein to respectively expose a surface region of the first and second polysilicon regions and having a third contact opening formed therein to expose a surface region of the doped region in the third contact region, conductive plug liner material formed on exposed surfaces of the first and second polysilicon regions, a Tungsten plug formed in the third contact opening, and first, second and third spaced-apart, electrically-insulated aluminum/aluminum alloy contacts formed in electrical contact with the plug liner material formed in the first and second oversized contact openings and with the Tungsten plug;

applying sufficient voltage to the first aluminum/aluminum alloy contact and the Tungsten plug to rupture the dielectric material oxide on the first contact region;

applying sufficient voltage to the second aluminum/aluminum alloy contact and the Tungsten plug to rupture the gate dielectric material on the second contact region; and providing sufficient current flow between the first and second aluminum alloy contacts to melt the plug liner material in the first and second polysilicon regions, thereby flowing the aluminum/aluminum alloy between the first and second aluminum/aluminum alloy contacts and forming a permanent anti-fuse conductive path in the silicon substrate and between the first and second aluminum alloy contacts.

2. A method as in claim 1, and wherein the plug liner material comprises titanium nitride (TiN).

3. A method as in claim 1, and wherein the insulating dielectric material comprises silicon dioxide.

4. A method as in claim 1, and wherein the gate dielectric material comprises silicon oxide.

5. A method as in claim 1, and wherein the conductive plug liner material formed in the first and second oversized contact openings has residual Tungsten sidewall spacer material formed thereon.

6. A bias-independent aluminum bridge anti-fuse structure in a Tungsten plug integrated circuit structure, the structure comprising:

a doped region formed in a silicon substrate;

first, second and third spaced-apart contact regions formed on a surface of the doped region;

the first and second contact regions having a layer of gate dielectric material formed thereon;

first and second polysilicon regions formed over the gate dielectric material on the first and second contact regions, respectively;

a layer of insulating dielectric material formed over the first and second polysilicon regions, the layer of insulating dielectric material having first and second oversized contact openings formed therein to respectively expose a surface region of the first and second polysilicon regions, and having a third contact opening formed therein to expose a surface region of the doped region in the third contact region;

conductive plug liner material formed on exposed surface of the first and second polysilicon regions;

first and second spaced-apart, electrically-insulated aluminum/aluminum alloy oversized contacts formed in the first and second oversized contact openings, respectively, and in electrical contact with the first and second polysilicon regions, respectively; and a Tungsten plug formed in the third contact opening in electrical contact with the doped region in the third contact region.

7. A structure as in claim 6, and wherein the plug liner material comprises titanium nitride (TiN).

8. A structure as in claim 6, and wherein the insulating dielectric material comprises silicon dioxide.

9. A structure as in claim 6, and wherein the gate dielectric material comprises silicon oxide.

10. A structure as in claim 6, and wherein the conductive plug liner material formed in the first and second oversized contact openings has residual Tungsten side-wall spacer material formed thereon.

* * * * *